United States Patent
Yeh et al.

(10) Patent No.: US 7,259,097 B2
(45) Date of Patent: Aug. 21, 2007

(54) CONTROL SYSTEM FOR MULTI-LAYER CHEMICAL MECHANICAL POLISHING PROCESS AND CONTROL METHOD FOR THE SAME

(75) Inventors: Ming-Hsin Yeh, Jhongli (TW); Cheng-Chuan Lee, Fenyuan Township, Changhua County (TW); Yi-Ching Wu, Yong-an Township, Kaohsiung County (TW); Chih-Hsiang Hsiao, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 49 days.

(21) Appl. No.: 11/233,625

(22) Filed: Sep. 22, 2005

(65) Prior Publication Data

US 2007/0062819 A1    Mar. 22, 2007

(51) Int. Cl.
*H01L 21/302* (2006.01)
*H01L 21/461* (2006.01)
(52) U.S. Cl. .................. 438/692; 438/959; 700/121
(58) Field of Classification Search .............. 700/121; 438/691, 692, 5, 8, 28, 41, 57, 65, 959; 451/5, 451/8, 28, 41, 57, 65
See application file for complete search history.

(56) References Cited

U.S. PATENT DOCUMENTS

| | | | |
|---|---|---|---|
| 6,517,412 B2* | 2/2003 | Lee et al. | 451/5 |
| 6,827,629 B2* | 12/2004 | Kim et al. | 451/5 |
| 6,932,671 B1* | 8/2005 | Korovin et al. | 451/5 |
| 7,097,534 B1* | 8/2006 | Yampolskiy et al. | 451/5 |
| 2002/0058460 A1* | 5/2002 | Lee et al. | 451/5 |
| 2004/0111175 A1* | 6/2004 | Kim et al. | 700/121 |
| 2005/0153557 A1* | 7/2005 | Cho et al. | 438/691 |
| 2005/0197046 A1* | 9/2005 | Aoyagi et al. | 451/5 |

* cited by examiner

*Primary Examiner*—Leo Picard
*Assistant Examiner*—Charles Kasenge
(74) *Attorney, Agent, or Firm*—J.C. Patents

(57) ABSTRACT

A method for controlling an apparatus to perform a multi-layer chemical mechanical polishing (CMP) process with a polishing rate for a plurality of process runs. For each process run, a multilayered structure with a first thickness formed on a wafer is polished and a second thickness of the multilayered structure is predetermined to be polished away. The method comprises steps of receiving a post-CMP thickness information of the multilayered structure of a first process run, wherein for the first process run, the CMP process is performed for a first CMP process time. Then, a second CMP process time is determined according to the first CMP process time, the first thickness and the post-CMP thickness. Further, the second CMP process time is provided to the apparatus for processing a second process run posterior to the first process run.

8 Claims, 2 Drawing Sheets

300

| Material | removal rate | polish condition |
|---|---|---|
| SiO$_x$ | Rx$_1$ | ⋮ |
| | Rx$_2$ | ⋮ |
| | Rx$_3$ | ⋮ |
| | ⋮ | |
| SiN$_x$ | Ry$_1$ | ⋮ |
| | Ry$_2$ | ⋮ |
| | | |
| | | |
| Copper | Rw$_1$ | ⋮ |
| | Rw$_2$ | ⋮ |
| | | |
| | | |
| poly | Rz$_1$ | ⋮ |
| | Rz$_2$ | ⋮ |
| | | |
| | | |
| ⋮ | ⋮ | ⋮ |

FIG. 2

CONTROL SYSTEM FOR MULTI-LAYER CHEMICAL MECHANICAL POLISHING PROCESS AND CONTROL METHOD FOR THE SAME

BACKGROUND OF THE INVENTION

1. Field of Invention

The present invention relates to a system for controlling a chemical mechanical polishing process and a control method for the same. More particularly, the present invention relates to a control system for controlling a multi-layer chemical mechanical polishing process and a control method for the same.

2. Description of Related Art

In the semiconductor process, with the decrease of the device size, the resolution of the photolithography is increased. Furthermore, with the decrease of the depth of focus, the demand for having a more even surface of the wafer is high.

Currently, the wafer planarization is accomplished by the chemical mechanical polishing (CMP) process. Typically, the CMP process possesses the advantages including low cost, high polishing rate and high planarization efficiency. However, in the CMP process, there still exists some drawbacks. For the multilayered structure composed of the stacked-heterogeneous material layers, the physical property of each stacked-heterogeneous material layer is different from each other so that the removal rate of each stacked-heterogeneous material layer is different from each other even though the polishing rate is fixed.

Typically, in order to precisely polish away a predetermined thickness of the multilayered structure, it is necessary to measure the thickness of the topmost stacked-heterogeneous material layer, the removal rate of the topmost stacked heterogeneous material layer and then to estimate the CMP process time of the topmost stacked-heterogeneous material layer. That is, the CMP process is performed to polish away one material layer at a time. Hence, it is not easy to well control a multi-layer CMP process on a multi-layered structure for polishing away a predetermined thickness. In addition, because the CMP process is performed to polish away one material layer at a time in the multi-layer CMP process, the through put is low and the cost is high.

SUMMARY OF THE INVENTION

Accordingly, at least one objective of the present invention is to provide a control system for controlling an apparatus to perform a multi-layer chemical mechanical polishing (CMP) process for a plurality of process runs. By using the control system, the total CMP process time for polishing a predetermined thickness of a multilayered structure can be well estimated.

At least another objective of the present invention is to provide a method for controlling an apparatus to perform a multi-layer process for a plurality of process runs. By using the method of the present invention, the total CMP process time for polishing a predetermined thickness of a multilayered structure composed of heterogeneous material layers with different removal rates can be well estimated.

To achieve these and other advantages and in accordance with the purpose of the invention, as embodied and broadly described herein, the invention provides a control system for controlling an apparatus to perform a multi-layer chemical mechanical polishing (CMP) process with a polishing rate for a plurality of process runs. For each process run, a multilayered structure with a first thickness formed on a wafer is polished and a second thickness of the multilayered structure is predetermined to be polished away. The control system comprises a receiver, an operation unit and a providing unit. The receiver receives a post-CMP thickness of the multilayered structure of a first process run, wherein for the first process run, the CMP process is performed for a first CMP process time. The operation unit determines a second CMP process time according to the first CMP process time, the first thickness and the post-CMP thickness. The providing unit provides the second CMP process time to the apparatus for processing a second process run posterior to the first process run.

In the present invention, the multilayered structure include at least two stacked heterogeneous-material layers. Also, the second CMP process time is determined according to:

$$Time_{second} = \frac{TK_{tg} \times Time_{first}}{TK_{org} - TK_{post}},$$

wherein $Time_{second}$ denotes the second CMP process time, $TK_{tg}$ denotes the second thickness, $Time_{first}$ denotes the first CMP process time, $TK_{org}$ denotes the first thickness and $TK_{post}$ denotes the post-CMP thickness. Furthermore, the operation unit further determines an initial CMP process time for a pilot process run which is the initial process run of the process runs. Moreover, the initial CMP process time is determined according to:

$$Time_{initial} = \frac{TK_{La} + \left(\frac{R_a}{R_b}\right)TK_{Lb} + \left(\frac{R_a}{R_c}\right)TK_{Lc} + \ldots}{R_a},$$

wherein $Time_{initial}$ denotes the initial CMP process time, each of $TK_{La}$, $TK_{Lb}$ and $TK_{Lc}$ denotes a thickness of each layer of the multilayered structure respectively, each of $R_a$, $R_b$ and $R_c$ denotes a removal rates of the each layer of the multilayered structure in the multi-layer CMP process performed by the apparatus with the polishing rate.

The present invention also provides a method for controlling an apparatus to perform a multi-layer chemical mechanical polishing (CMP) process with a polishing rate for a plurality of process runs. For each process run, a multilayered structure with a first thickness formed on a wafer is polished and a second thickness of the multilayered structure is predetermined to be polished away. The method comprises steps of receiving a post-CMP thickness information of the multilayered structure of a first process run, wherein for the first process run, the CMP process is performed for a first CMP process time. Then, a second CMP process time is determined according to the first CMP process time, the first thickness and the post-CMP thickness. Further, the second CMP process time is provided to the apparatus for processing a second process run posterior to the first process run.

In the present invention, the multilayered structure include at least two stacked heterogeneous-material layers. Also, the second CMP process time is determined according to:

$$Time_{second} = \frac{TK_{tg} \times Time_{first}}{TK_{org} - TK_{post}},$$

wherein $Time_{second}$ denotes the second CMP process time, $TK_{tg}$ denotes the second thickness, $Time_{first}$ denotes the first CMP process time, $TK_{org}$ denotes the first thickness and $TK_{post}$ denotes the post-CMP thickness. Furthermore, the operation unit further determines an initial CMP process time for a pilot process run which is the initial process run of the process runs. Moreover, the initial CMP process time is determined according to:

$$Time_{initial} = \frac{TK_{La} + \left(\frac{R_a}{R_b}\right)TK_{Lb} + \left(\frac{R_a}{R_c}\right)TK_{Lc} + \ldots}{R_a},$$

wherein $Time_{initial}$ denotes the initial CMP process time, each of $TK_{La}$, $TK_{Lb}$ and $TK_{Lc}$ denotes a thickness of each layer of the multilayered structure respectively, each of $R_a$, $R_b$ and $R_c$ denotes a removal rates of the each layer of the multilayered structure in the multi-layer CMP process performed by the apparatus with the polishing rate.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2 is a schema illustrating a database according to one of the preferred embodiment of the present invention.

DESCRIPTION OF THE PREFERRED EMBODIMENTS

Figure 1:
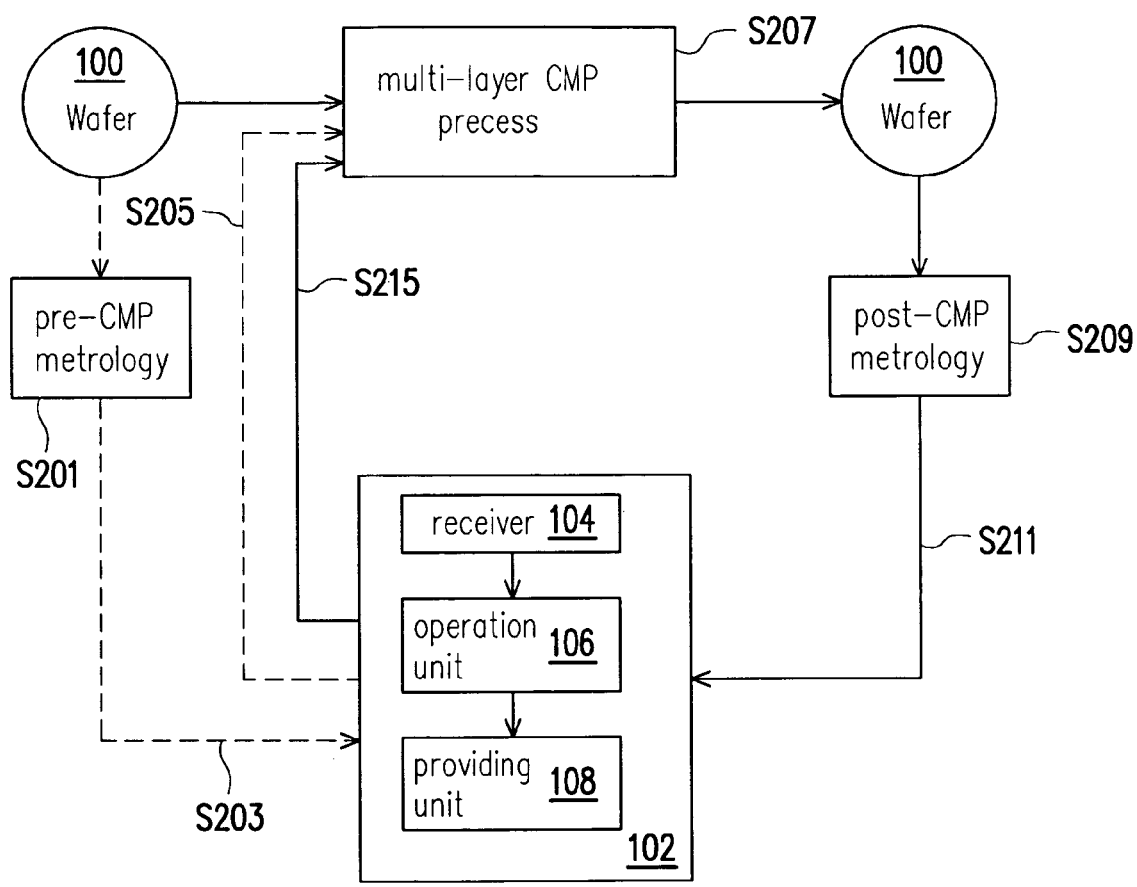
FIG. 1 is a process flow diagram, schematically illustrating a run-to-run controlling method according to one of the preferred embodiment of the present invention.

In the invention, a novel control system and a novel run-to-run controlling method are proposed. In control system and the controlling method provided by the present invention, the CMP process time for each process run is adjusted depends on a metrology result of a prior process run. That is, after one process run of the multi-layer CMP process is finished, a result thickness of the multilayered structure on a wafer is obtained by performing a post-CMP metrology and is provided to the control system for the further analyzing. By referring to the result thickness, the predetermined polishing amount and the total thickness of the multilayered structure, the CMP process time for the posterior process run can be well predicted.

FIG. 1 is a process flow diagram, schematically illustrating a run-to-run controlling method according to one of the preferred embodiment of the present invention. As shown in FIG. 1, at the beginning of the run-to-run multi-layer CMP process, a pilot process run is performed. That is, the pilot process run is the initial process run in the order of the serial CMP process runs. Before the pilot process run is started, in the step S201, a thickness information of a multilayered structure formed on a wafer 100 is obtained by using a pre-CMP metrology process. Furthermore, the multilayered structure comprises at least two stacked-heterogeneous material layers. That is, the material layers in the multilayered structure are made of materials which are different in physical property from each other. Moreover, the materials comprises silicon oxide, silicon nitride, copper, metal silicide, polysilicon etc. The thickness information comprises a thickness $TK_{org}$ of the multilayered structure and the thickness of each stacked-heterogeneous material layer. In addition, the pre-CMP metrology process for obtaining the thickness information before the multi-layer CMP process is performed can be, for example but not limited to, accomplished by using an ellipsometer.

Thereafter, in the step S203, the thickness information and an information about polish rate $R_i$ which is going to be used in the multi-layer CMP process are provided to an operation unit 106 through a receiver 104 of a control system 102. The control system 102 is used for controlling the run-to-run multi-layer CMP process. The operation unit 106, for example but not limited to, is connected to a database system 300 (as shown in FIG. 2) for storing removal rates according to the polished material and the polishing rate of the conventional CMP process. In the operation unit 106, by referring to the database system 300, an initial CMP process time is determined according to the thickness information and the polish rate information. That is, the initial CMP process time can be calculated by using the following equation (1):

$$Time_{initial} = \frac{TK_{La} + \left(\frac{R_a}{R_b}\right)TK_{Lb} + \left(\frac{R_a}{R_c}\right)TK_{Lc} + \ldots}{R_a} \quad (1)$$

where $Time_{initial}$ denotes the initial CMP process time and each of $TK_{La}$, $TK_{Lb}$ and $TK_{Lc}$ denotes a thickness of each layer of the multilayered structure respectively. Furthermore, each of $R_a$, $R_b$ and $R_c$ denotes a removal rates of the each layer of the multilayered structure in the multi-layer CMP process performed by the apparatus with the polishing rate $R_i$. In equation (1), since the removal rates such as $R_a$, $R_b$ and $R_c$, of the heterogeneous material layers are different from each other, the thickness, such as $TK_{La}$, $TK_{Lb}$ and $TK_{Lc}$, of heterogeneous material layers are re-calculated to be the equivalent thickness according to a main removal rate such as $R_a$ recited above. By normalizing the thickness of each heterogeneous material layer according to the main removal rate, the total initial CMP process time can be predicted. Notably, although the main removal rate in this embodiment is recited above, the main removal rate is not limited to and can be one of the removal rates of the heterogeneous material layers.

Thereafter, as shown in FIG. 1, the initial CMP process time $Time_{initial}$ is provided to an apparatus from the control system 102 through a providing unit 108 (step S205). Thus, for the pilot process run (step S207), the multi-layer process is performed to polish the multilayered structure on the wafer 100 with the polishing rate $R_i$ for a predetermined polished thickness $TK_{tg}$.

After the pilot process is finished, a post-CMP metrolody process is performed (step 209) to measure a post-CMP thickness $TK_{post}$ of the multilayered structure remained on the wafer 100. Then, in the step S211, the post-CMP thickness $TK_{post}$ is provided to the operation unit 106 through the receiver 104 of the control system 102 for further estimating a new CMP process time for the posterior process run.

The operation unit 106 not only is used to calculate the pilot process time but also is used to calculate the CMP process time for the posterior process run. The new process time can be calculated by using the following equation (2):

$$Time_{new} = \frac{TK_{tg} \times Time_{initial}}{TK_{org} - TK_{post}} \quad (2)$$

where $Time_{new}$ denotes the new CMP process time. In equation (2), the ratio of predetermined polished thickness $TK_{tg}$ to the actual polished thickness, which is the difference between the thickness $TK_{org}$ of the multilayered structure before the pilot process run is performed and the post-CMP thickness $TK_{post}$ of the multilayered structure, is an adjustment factor of the initial CMP process time for obtaining the new CMP process time $Time_{new}$.

Thereafter, the new CMP process time $Time_{new}$ is provided to the apparatus from the control system 102 through the providing unit 108 (step S215). According to the new CMP process time $Time_{new}$, in another process run right posterior to the pilot process run, the multi-layer CMP process is performed to polish the multilayered structure on another wafer 100 with the polishing rate $R_i$ for a predetermined polished thickness $TK_{tg}$ (step S207).

By following the run-to-run process flow indicated by the solid arrows, the polish result, which includes the post-CMP thickness of the multilayered structure, of each process run is fed back to the control system 102 for calculating a posterior CMP process time $Time_{second}$ according to the current CMP process time $Time_{first}$, the post-CMP thickness $TK_{post}$ and the thickness $TK_{org}$ of the multilayered structure before the current multi-layer CMP process is performed. The posterior CMP process time $Time_{second}$ can be obtained by applying the following equation (3):

$$Time_{second} = \frac{TK_{tg} \times Time_{first}}{TK_{org} - TK_{post}} \quad (3)$$

Notably, equation (2) is identical to equation (3) except that equation (2) is used to calculate the CMP process time of a process run right posterior to the pilot process run and equation (3) is used to calculate the CMP process time for a process run right after the current process run.

Practically, all the steps performed in the control system 102 can be performed by executing a computer program code via at least one electric calculator, such as computer. That is, the receiver 104, the operation unit 106 and the providing unit 108 in the control system 102 for performing the operations corresponding to the steps mentioned above can be, for example but not limited to, represented by the computer program codes respectively. Furthermore, the computer program code mentioned above can be a program code consisted of several sub-program code and program segments.

In the present invention, the initial CMP process time of the pilot process run can be obtained by following the process flow indicated by the dotted arrows shown in FIG. 1. Further, for each process after the pilot process run, the process flow indicated by the solid arrows as described above. That is, the CMP process time for each process run depends on the polish result of it's prior process run. Therefore, even though the material layers of the multilayered structure are made of materials different from each other and the removal rates of the material layers are different from each other as well, the total CMP process time of the multilayered structure for polishing away a predetermined amount can be well predicted and finitely adjusted from run to run. Hence, for each process run, the multilayered structure can be polished in a single multi-layer CMP process by applying only one CMP process time. Furthermore, the actual polished amount of the multilayered structure in the single multi-layer CMP process can be well controlled.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A control system for controlling an apparatus to perform a multi-layer chemical mechanical polishing (CMP) process with a polishing rate for a plurality of process runs, wherein for each process run, a multilayered structure with a first thickness formed on a wafer is polished and a second thickness of the multilayered structure is predetermined to be polished away, the control system comprising:
    a receiver for receiving a post-CMP thickness of the multilayered structure of a first process run, wherein for the first process run, the CMP process is performed for a first CMP process time;
    an operation unit for determining a second CMP process time according to the first CMP process time, the first thickness and the post-CMP thickness; and
    a providing unit for providing the second CMP process time to the apparatus for processing a second process run posterior to the first process run, wherein the second CMP process time is determined according to:

$$Time_{second} = \frac{TK_{tg} \times Time_{first}}{TK_{org} - TK_{post}},$$

wherein $Time_{second}$ denotes the second CMP process time, $TK_{tg}$ denotes the second thickness, $Time_{first}$ denotes the first CMP process time, $TK_{org}$ denotes the first thickness and $TK_{post}$ denotes the post-CMP thickness.

2. The control system of claim 1, wherein the multilayered structure include at least two stacked heterogeneous-material layers.

3. The control system of claim 1, wherein the operation unit further determines an initial CMP process time for a pilot process run which is the initial process run of the process runs.

4. The control system of claim 3, wherein the initial CMP process time is determined according to:

$$Time_{initial} = \frac{TK_{La} + \left(\frac{R_a}{R_b}\right)TK_{Lb} + \left(\frac{R_a}{R_c}\right)TK_{Lc} + \ldots}{R_a},$$

wherein Time$_{initial}$ denotes the initial CMP process time, each of TK$_{La}$, TK$_{Lb}$ and TK$_{Lc}$ denotes a thickness of each layer of the multilayered structure respectively, each of R$_a$, R$_b$ and R$_c$ denotes a removal rates of the each layer of the multilayered structure in the multi-layer CMP process performed by the apparatus with the polishing rate.

5. A method for controlling an apparatus to perform a multi-layer chemical mechanical polishing (CMP) process with a polishing rate for a plurality of process runs, wherein for each process run, a multilayered structure with a first thickness formed on a wafer is polished and a second thickness of the multilayered structure is predetermined to be polished away, the method comprising:

receiving a post-CMP thickness information of the multilayered structure of a first process run, wherein for the first process run, the CMP process is performed for a first CMP process time;

determining a second CMP process time according to the first CMP process time, the first thickness and the post-CMP thickness; and providing the second CMP process time to the apparatus for processing a second process run posterior to the first process run, wherein the second CMP process time is determined according to:

$$Time_{second} = \frac{TK_{tg} \times Time_{first}}{TK_{org} - TK_{post}},$$

wherein Time$_{second}$ denotes the second CMP process time, TK$_{tg}$ denotes the second thickness, Time$_{first}$ denotes the first CMP process time, TK$_{org}$ denotes the first thickness and TK$_{post}$ denotes the post-CMP thickness.

6. The method of claim 5, wherein the multilayered structure include at least two stacked heterogeneous-material layers.

7. The method of claim 5, wherein the operation unit further determines an initial CMP process time for a pilot process run which is the initial process run of the process runs.

8. The method of claim 7, wherein the initial CMP process time is determined according to:

$$Time_{initial} = \frac{TK_{La} + (R_a/R_b)TK_{Lb} + (R_a/R_c)TK_{Lc} + \ldots}{R_a},$$

wherein Time$_{initial}$ denotes the initial CMP process time, each of TK$_{La}$, TK$_{Lb}$ and TK$_{Lc}$ denotes a thickness of each layer of the multilayered structure respectively, each of R$_a$, R$_b$ and R$_c$ denotes a removal rates of the each layer of the multilayered structure in the multi-layer CMP process performed by the apparatus with the polishing rate.

* * * * *